United States Patent [19]

Wu

[11] Patent Number: 5,355,002
[45] Date of Patent: Oct. 11, 1994

[54] STRUCTURE OF HIGH YIELD THIN FILM TRANSISTORS

[75] Inventor: Biing-Seng Wu, Hsin-Chu, Taiwan

[73] Assignee: Industrial Technology Research Institute, Hsinchu, Taiwan

[21] Appl. No.: 5,794

[22] Filed: Jan. 19, 1993

[51] Int. Cl.$^5$ ............... H01L 29/04; H01L 31/036; H01L 29/36; H01L 27/01

[52] U.S. Cl. ...................... 257/57; 257/59; 257/66; 257/72; 257/347

[58] Field of Search ............ 257/57, 59, 66, 72, 257/347, 348, 349, 350, 351, 352, 353, 354

[56] References Cited

U.S. PATENT DOCUMENTS 5,166,085  11/1992  Wakai et al. .................... 257/59

FOREIGN PATENT DOCUMENTS 59-124165  7/1984  Japan ............................ 257/57

OTHER PUBLICATIONS

IEDM, 88, "An a-Si TFT With a New Light-Shield Structure and Its Application to Active Matrix Liquid–Crystal Displays" by Akiyama et al., p. 268–p. 271.

Proceeding of the SID, vol. 28/2, 1987, "A 10-in. Diagonal Active Matrix LCD Addressed by a-Si TFTS" by Sakamoto et al., p. 145–p. 148.

J. Electrochem. Soc., vol. 139, No. 2, Feb. 1992, "Reductive Corrosion of ITO in Contact With Al in Alkaline Solutions" by Meerakker et al., p. 385–p. 390.

Primary Examiner—Rolf Hille
Assistant Examiner—Steven Loke
Attorney, Agent, or Firm—H. C. Lin

[57] ABSTRACT

In an active matrix liquid crystal display, an extra insulating layer is deposited over the active region of the thin film transistor and the transparent electrode of the picture element. The interconnection between the source electrode of the TFT and the transparent electrode lies over the extra insulating layer. The edge between the a-Si and S/D electrode contact is passivated by the extra insulating to avoid direct contact of the S/D metal electrode with the undoped amorphous silicon channel. Contacts to the TFT source and drain electrodes are made through a heavily-doped amorphous silicon to avoid direct contact of aluminum with undoped amorphous silicon channel, which can eliminate dark leakage current with negative gate bias. The metal contact to the transparent electrode is made via a contact hole in the extra insulating layer to avoid the etching solution of aluminum interconnection from attacking the transparent electrode. The extra insulating layer also prevents short circuit between the signal lines and the transparent electrodes.

9 Claims, 6 Drawing Sheets

STRUCTURE OF HIGH YIELD THIN FILM TRANSISTORS

BACKGROUND

This invention relates to thin film transistors (TFT), in particular to TFT for use in active matrix liquid crystal display (LCD) systems.

TFTs are widely used for LCD panels. In such a TFTLCD system, each picture element (pixel) has a LCD device and a switch to turn on and off the LCD device. A matrix of pixels are placed at the cross-points of a number of rows of sequential scan signals and a number of columns of data signals. When a scan signal and a data signal is coincident at a certain cross-point, the pixel at that particular cross-point is activated. The coincident addressing of this particular pixel is accomplished by a TFT, where the scan signal may be applied to the gate of the TFT and the data signal may be impressed on the drain of the TFT and driving the corresponding LCD from the source of the TFT.

There are a number of structures for TFTs as described in a paper by M. Akiyama et al, "An a-Si TFT with a New Light-Shield Structure and Its Application to Active Matrix Liquid Crystal Displays" *IEEE International Electron Devices Meeting Proceedings*, Dec. 1988, pp.268–271. In general, FIGS. 1(a), 1(b) and 1(c) show the cross-sectional views of the conventional amorphous silicon (a-Si) TFTs. They are referred as type-A, type-B and type-C.

The fabrication processes of type A and type B a-Si TFTs are as follows: (1). Deposit a metal film as the gate 11 of the TFT on a transparent substrate 10. (2) Deposit a silicon nitride (a-SiN) 12, an amorphous silicon (a-Si) 13, and heavily-doped a-Si (n+ a-Si) 14 films on the substrate. (3) Etch the n+ a-Si 14 and a-Si 13 films except the active region of the TFT by the standard photolithographic and dry etching processes. (4) Form indium-tin oxide (ITO) as a transparent electrode 20 for LCD device. (5) Open the contact holes of the TFTs. (6) Form the source and drain contact metal 16 of the TFT. (7) Etch the n+ a-Si layer 14 between the source and the drain electrodes by dry etching. Because there is no etching stopper in the type A and type B TFTs, step 7 is controlled by the etching time, which is critical, and the thickness of the a-Si layer must be much thicker than that of the n+ a-Si layer 14. Typically, the thickness of the a-Si layer 13 is more than 2000 Angstroms.

Type A and type B TFTs have the same structure except that in the type A TFT, the a-Si layer protrudes beyond both edges of the gate electrode, as described by Sakamoto et al in the paper, "A 10-In.-DIAGONAL ACTIVE-MATRIX LCD ADDRESSED BY a-Si TFTs", *Proceedings of the SID*, Vol.28/2, 1987, pp.145–148. In the type B TFT, the a-Si layer is located completely inside the shadow of the gate electrodes. When this device is operated in the back gate illumination condition, leakage current is observed in the type A structure, because carriers are generated in the illuminated protruded region due to photoelectric effect. Thus, the type A TFT cannot be used in the TFTLCD. For the type B structure, the a-Si layer is totally shielded by the gate electrode. Thus, there is no photocurrent when it is operated in the backside illumination condition. However, during fabrication, the a-SiN layer 12, i.e. the gate insulating layer 12, beyond the active region is attacked during the n+ a-Si and a-Si etching step (Step 3). Therefore, the yield of the type-B structure is very poor when it is used for the TFTLCD which is a matrix array of a large number of pixels.

In order to improve the yield of the TFT, an a-Si TFT which has a second layer of a-SiN 18 has been developed as shown in FIG. 1(c). The fabrication process of this type-C device is similar to that of type A and type B., except that the top nitride (a-SiN) layer is deposited after the deposition of the a-Si film and the top a-SiN layer is removed from the source and drain (S/D) contact regions before the deposition of the n+ a-Si layer. The top a-SiN layer remains in the channel region of the transistor, and can be used as the etching stopper during etching of the n+ a-Si layer between the source and drain electrodes because the a-SiN is resistant to Si etch. The thickness of the a-Si layer can be made very thin, typically less than 500 Angstroms. The a-Si layer can protrude outside both the edges of the gate electrode without incurring substantial amount of leakage current. Because the a-Si layer that protrudes outside both the edges of the gate electrode are very thin, the protruded layer absorbs very few incident photons. Since the gate insulating a-SiN layer is not attacked during the formation of the active region, the type-C device has a higher manufacturing yield than the type-B device.

In the type-A and type-B devices, the channel length is equal to the space between the source and the drain electrodes 16. In the type-C device, the channel length is equal to the length of the top a-SiN 18 and is longer than the space between the source-drain electrodes 16. Thus, if the same design rule is used, the channel length of the type-C device must be longer than that of type A or type B devices. Thus, the type C device occupies a large area, and is not suitable for high resolution displays. The detailed discussion of this effect is described in a paper by H. Katoh, "TFT-LCD Technology Achieves Color Notebook PC", *Nikkei Electronics ASIA*, April, pp.68–71, 1992.

In the foregoing type-A, type-B or type-C TFT, the data signal line and the source and drain electrodes are formed at the same time. There is no insulating layer between the data signal line and the ITO electrode for the pixel. Consequently, it is easy for the data signal line 17 and the ITO electrode 20 to bridge. FIG. 2 shows the top view of the pixel. If there is a bridge formed between the signal line 17 and the pixel 20 due to defective processing, the signal bypasses the TFT switch and apply directly to the pixel electrode 20. FIG. 3(A) shows the cross-sectional view along the A-A' line in FIG. 2. FIG. 3(B) shows the cross-sectional view along the B-B' line in FIG. 2. When the signal line and the pixel electrode produces a short circuit as shown in FIG. 3(B), the LCD display is impaired.

In a co-pending U.S. patent application, Ser. No. 07/875,651, filed Apr. 29, 1992, the foregoing shortcoming of prior art is overcome by adding an insulating layer on the gate before the a-Si layer is deposited. Thus, this insulating layer can be grown at a high temperature, and free from pin holes. The a-Si layer is shielded by the gate electrode to reduce the generation of leakage photo-current and to reduce the geometry of the structure. The structure also reduces the step at the interconnection crossings to avoid breakage. These effects improve the fabrication yield of the TFT LCD panels.

Although the structure disclosed in the co-pending application has substantially reduced the leakage current whet there is backside illumination, it has been found that the dark leakage current is larger than the dark leakage current of the structures with a-Si channels protruded outside the shadows of the gate electrode when negative bias is applied to the gate. This observation was described in a paper, "Leakage current of amorphous silicon thin film transistor", ROC Symposium on EDMS, p.513, 1991. In this paper, it was explained that at the edge between the a-Si and S/D electrode contact, holes flow from the a-Si/Al edge of the drain electrode to the channel region. At the edge where the a-Si is in contact with the metal, the leakage current of the TFT increases when a negative voltage is applied to the gate. The increased dark current is dominated by the trap-assisted tunneling current which is induced by the electric field of the metal/semiconductor (M/S) contact by increasing the negative gate bias or/and increasing the drain bias. The leakage current may be due to the metal precipitates into the a-Si layer in the drain edge of the a-Si layer. The metal precipitates enhance the trap state density at the contact region. Under high electric field, the electron-hole pairs are generated via the traps at the M/S contact of the drain region.

An additional shortcoming is shown in FIG. 4, which is the cross-sectional view along the C-C' line in FIG. 2. The commonly used material for reducing the resistivity of the signal line is aluminum, which is in direct contact with the pixel electrode 20, i.e. the ITO material. In FIG. 2 is shown the data signal line 17 and the scan line 19 for the TFT. When Tab Automatic Bonding technique (TAB) is used to connect these lines from the driving circuit to the top display surface, the ITO material serves as an input pad. Then, aluminum is used to connect the signal line and the scan line directly to the ITO input pads. When an aluminum and ITO contact encounters a base solution, the contact edge between the aluminum and ITO can easily be eroded as described in a paper by J. E. A. M. van den Meerakker et al."Reductive Corrosion of ITO in Contact with Al in Alkaline Solutions", *J. Electrochem. Soc,*,Vol.139 No.2, Feb. 1992, pp.385-390. Such base solution is commonly used to remove the photo-resist for patterning the aluminum metal. When such erosion occurs, the display becomes speckled, and, in a more serious situation, the contact between the ITO and the aluminum may become discontinuous. FIG. 4(A) shows the situation without any erosion, and FIG. 4(B) shows the situation with erosion.

SUMMARY

An object of this invention is to construct a thin film transistor (TFT) for active matrix liquid crystal display which has low leakage photo-current due to backside illumination, as well as low dark leakage current with negative gate bias condition. Another object of this invention is to construct a TFT smaller than conventional TFT. A further object of this invention is to consturct a TFT with a high yield process by avoiding the bridging between the metal signal line and the ITO. Still another object of this invention is to further improve the yield by avoiding the corrosion at the edge of the aluminum and the ITO contact when the photoresist for patterning the aluminum is removed in a base solution. A still further object of this invention is to avoid the contamination of indium on the active amorphous silicon layer of a TFT. A last object of this invention is to reduce the stray capacitance between the gate electrode and the source electrode of the TFT.

These objects are achieved by depositing an insulating layer after the transparent ITO electrode is formed. The part of this insulating layer is over the central part of the TFT active channel region are successively etched away. The a-Si region is in the shadow of the gate to reduce leakage current under backside illumination. The edge of the a-Si region is passivated by the extra insulating layer film, and metal connections to the source and drain elctrodes are buffered through n+ a-Si and not directly to the a-Si to reduce the dark leakage current when the gate is negatively biased. This insulating layer also separates the signal line and the pixel electrode to avoid any bridge formation. The metal contact to the ITO is made through a via hole in the insulating layer, and patterning of the metal is done over the insulating layer. Thus, the base solution for etching the aluminum metal cannot erode the ITO beneath the insulating layer. With this structure and process, the fabrication yield is substantially improved. By raising the metal contact to the top by two insulating layers, the stray capacitance between the bottom gate and the top drain contact is also reduced. The edge of the Al electrode is not in contact with the ITO electrode directly to prevent an open circuit due to corrosion.

DETAILED DESCRIPTION OF THE PREFERRED EMBODIMENT

Figure 1A:
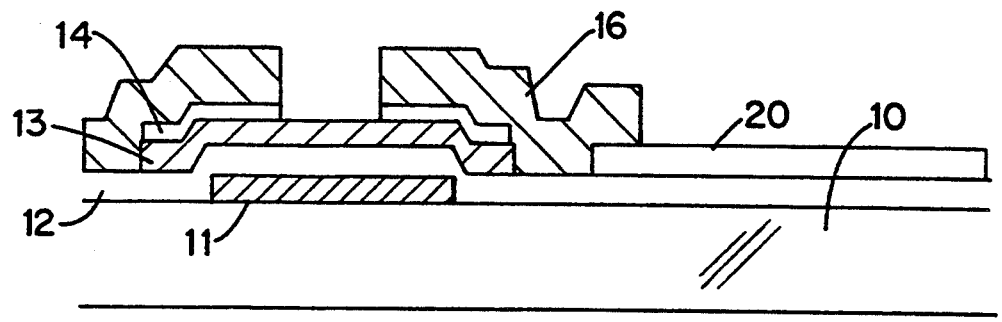
FIG. 1 shows the structures of conventional thin film transistors: (a) Type-A TFT. (b) Type-B TFT, (c) Type-C TFT.

FIG. 5 shows the process flow of the first embodiment of this invention for fabricating a high yield a-Si TFT. The process includes the following steps:

(a) Deposit and pattern a gate electrode 11 such as Al, Cr, Mo, Ta or some other refractory metal on a transparent substrate 10.

(b) Deposit a first insulating layer 12 such as silicon nitride or silicon nitride, an amorphous silicon film 13 and a heavily doped amorphous silicon film 14 on the substrate.

(c) Etch the heavily doped amorphous silicon film 14 and the amorphous silicon film 13 using conventional photolithographic process except the TFT active region. The width of the TFT active region is smaller than the width of the gate electrode 11, the region outside the TFT active region and above the gate electrode is defined as the field region.

(d) Deposit and pattern the transparent electrode 20 of the display device, using such material as ITO, etc.

(e) Deposit a second insulating layer 15.

(f) Open windows in the second insulating layer 15 over the active region of the TFT and the contact hole of the ITO pixel electrode 20. At the same time, open contact windows for the scan line 19 by etching through the second insulating layer 15 and the first insulating layer 12.

(g) Deposit and pattern the metal source and drain electrodes 16.

(h) Remove the heavily doped amorphous silicon 14 between the source and drain electrodes 16.

Figure 1B:
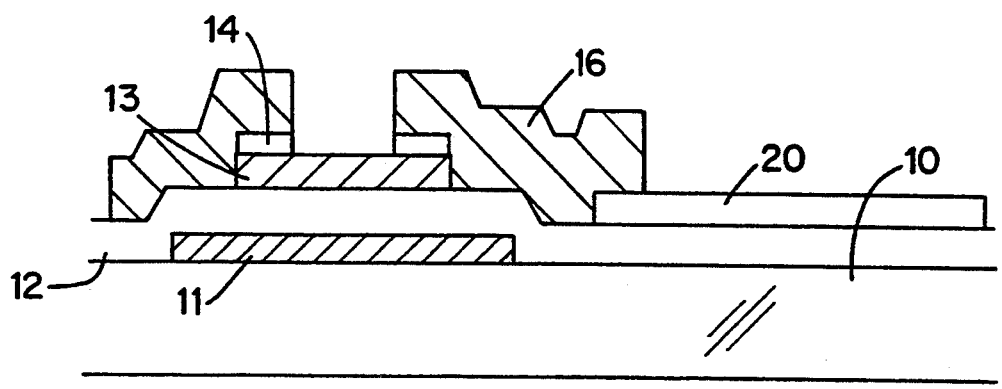
Figure 1C:
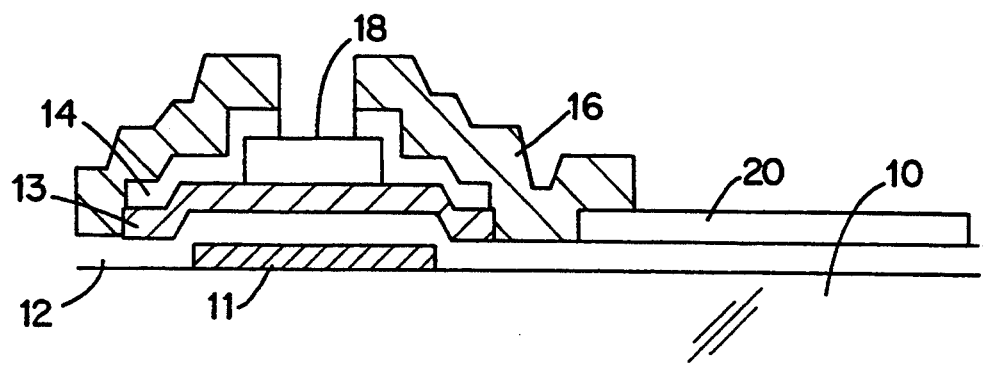
Figure 2:
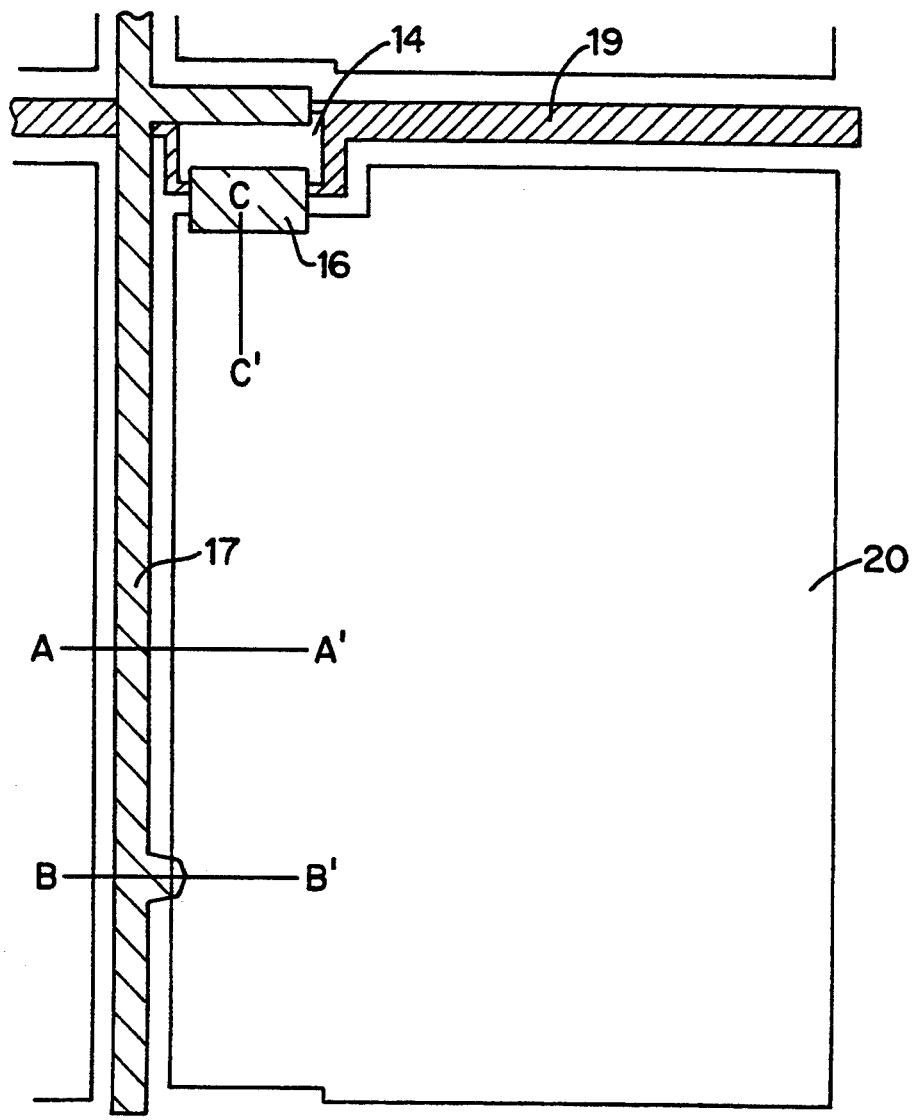
FIG. 2 shows the top view of a TFT.
Figure 3A:
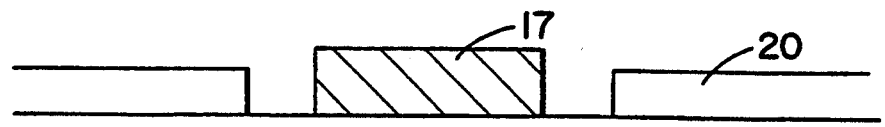
FIG. 3(A) shows the cross-sectional view of a conventional TFT in a LCD matrix along the section line A-A' in FIG. 2.
Figure 3B:
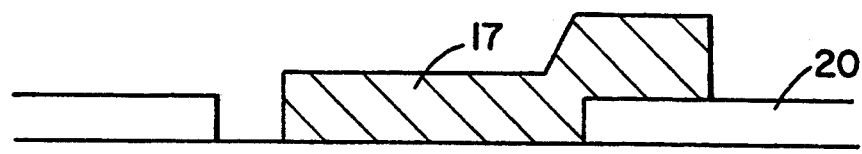
FIG. 3(B) shows the cross-sectional view along the section line B-B' in FIG. 2.
Figure 4A:
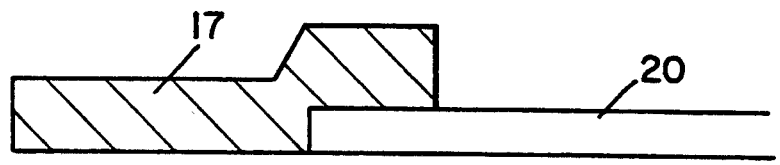
FIGS. 4(A) and 4(B) show the cross-sectional view of a contact edge between ITO and aluminum of a conventional TFT in a LCD matrix along the section line C-C'. FIG. (A) shows a normal contact without any corrosion. FIG. (B) shows a corrosion phenomenon.
Figure 4B:
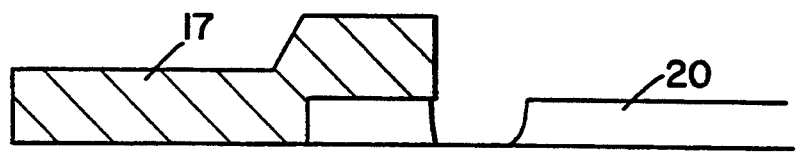

This invention has the same number of mask layers as the type A or type B TFT in FIG. 1. To prevent damage to the heavily doped amorphous silicon layer 14 during etching of the first insulating layer 12, step (f) can be divided into two masking steps: one to etch out the channel region and the contact window for the pixel ITO electrode 20; the other to open the contact window for the scan line 19. Then the masking steps are one more than that for the conventional type-A or type-B TFT.

In comparison with the conventional type-A, type-B or type-C TFTs, this new invention has the following advantages:

(1) The new structure requires one less masking step than the type-C TFT.

(2) For backside illumination, the shield prevents the production of leakage current similar to the type-B TFT structure and gives better result than the type-A and type-C TFT.

(3) The edge of the amorphous silicon layer 13 is covered with the second insulating layer 15 and not in direct contact with the drain and source metal electrodes 16. Therefore, under dark condition with the gate negatively biased, the leakage current is very small similar to the type-A and type-C structures.

Figure 6A:
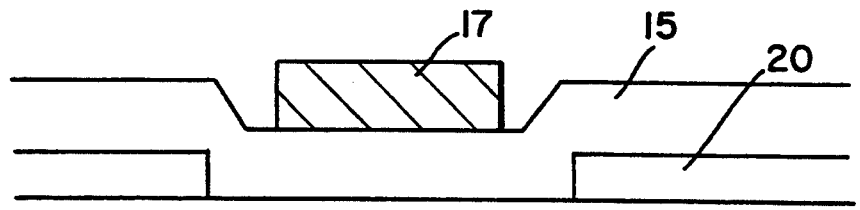
FIG. 6(a) shows the cross-sectional view along the section line A-A' in FIG. 2 based on this invention.
Figure 6B:
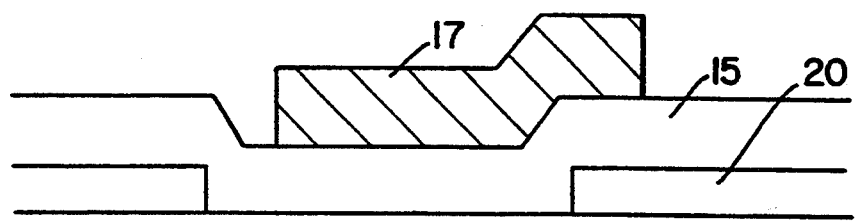
FIG. 6(B) shows the cross-sectional view along the section line B-B' line in FIG. 2.
Figure 5A:
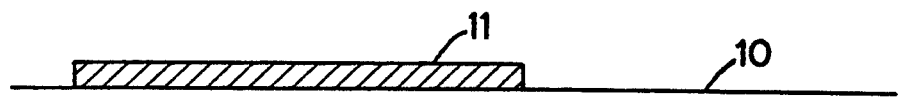
FIGS. 5(a)-(h) show the fabrication steps of the first embodiment of this invention.
Figure 5B:
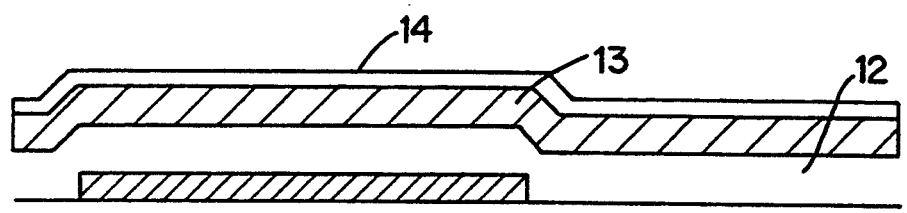
Figure 5C:
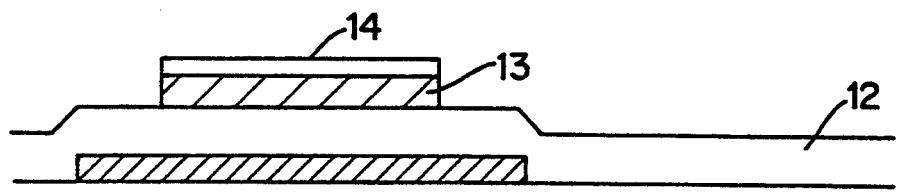
Figure 5D:
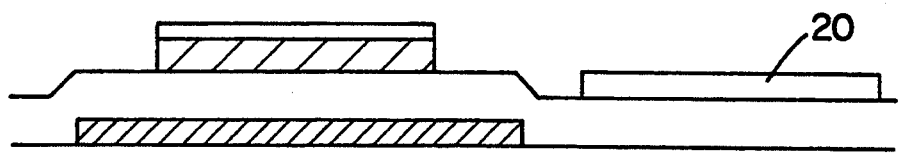
Figure 5E:
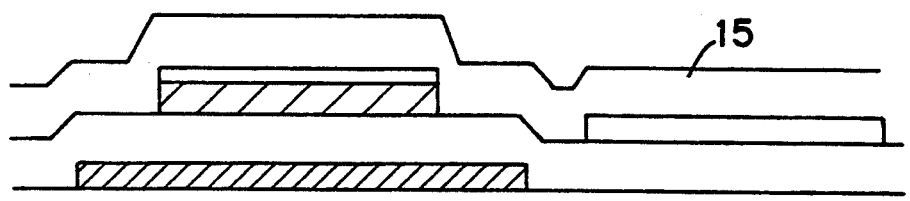
Figure 5F:
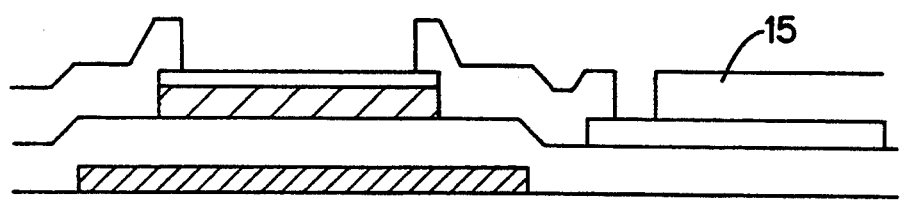
Figure 5G:
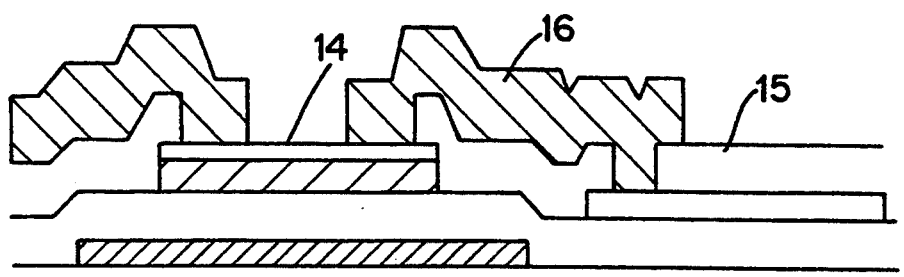
Figure 5H:
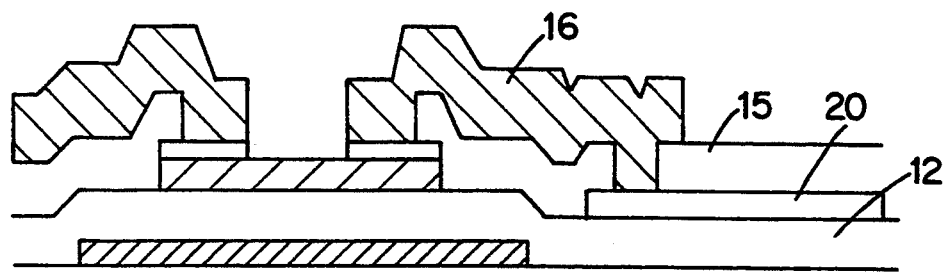

(4) The signal line 17 is separated from the ITO pixel electrode 20 by the second insulating layer 15 as shown in FIG. 6(a). If there is fabrication defect in the ITO electrode 20 or in the signal line 17, the second insulating layer 15 prevents any short circuit between these two parts and hence any defect in the display as shown in FIG. 6(b).

Figure 7:
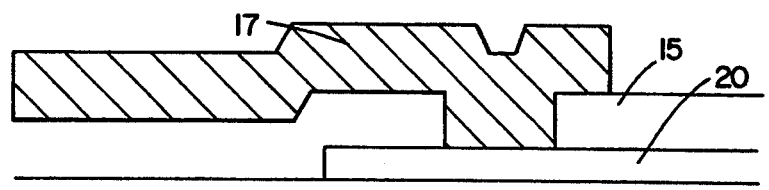
FIG. 7 shows the cross-sectional view along the section line C-C' in FIG. 2 based on this invention.
Figure 8A:
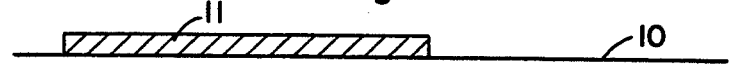
FIGS. 8(a)-(h) show the fabrication steps of the second embodiment of this invention.
Figure 8B:
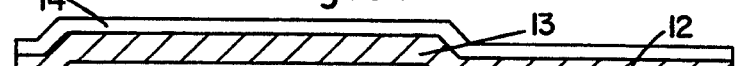
Figure 8C:
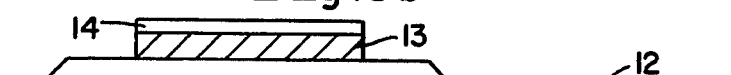
Figure 8D:
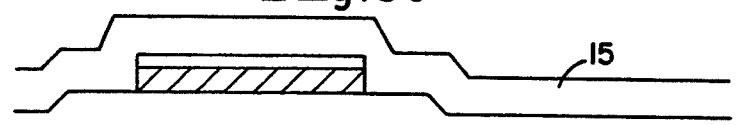
Figure 8E:
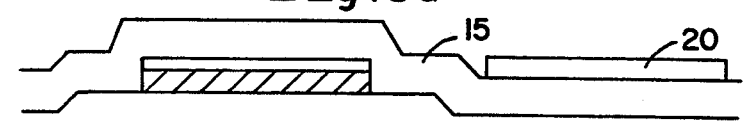
Figure 8F:
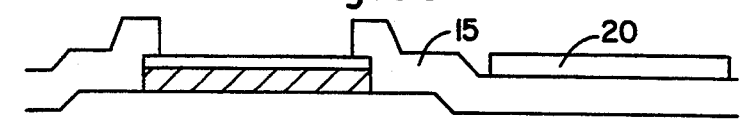
Figure 8G:
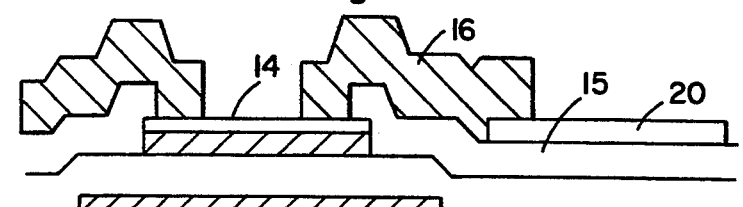
Figure 8H:
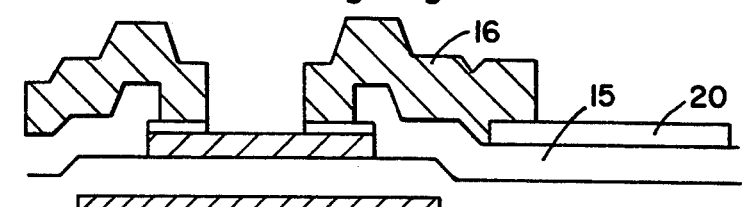

(5) In the TFT LCD using this fabrication process and structure, the edge at the contact between the aluminum metal and the ITO is protected with the second insulating layer 15, as shown in FIG. 7. Then there can be no erosion of the ITO due to the base solution for removing the photoresist used for patterning the aluminum.

(6) The cross-over region between the signal line 17 and the scan line is separated by two layers of first insulating layer 12 and the second insulating layer 15. Thus the likehood of short circuit between these two lines is greatly reduced.

(7) Except for the direct contact between the n+ a-Si layer 14 and the drain-source electrodes 16, the field regions between the gate electrode and the source electrode are separated by two insulating layers (i.e. the first insulating layer 12 and the second insulating layer 15). This structure not only prevents short circuit between the gate electrode and the drain and source electrodes, but also reduces the stray capacitance.

FIG. 8 shows a second embodiment of this invention for fabricating a high yield TFT. The fabrication steps are as follows:

(a) Deposit and pattern a gate electrode 11 such as Al, Cr, Mo, Ta or some other refractory metal on a transparent substrate 10.

(b) Deposit a first insulating layer 12 such as silicon nitride or silicon oxide, an amorphous silicon film 13 and a heavily-doped amorphous silicon 14 on the substrate.

(c) Etch the heavily-doped amorphous silicon film 14 and the amorphous silicon film 13 with conventional photo-etching process except the active region of the TFT.

(d) Deposit a second insulating layer 15 such as silicon nitride or silicon oxide.

(e) Deposit a transparent electrode 20 in the display area, using material such as indium-tin oxide (ITO).

(f) Open a window in the insulating layer 15 over the channel region and the contact regions of the TFT. At the same time, open contact windows for the scan line 19 through the second insulating layer 15 and the first insulating layer 12.

(g) Form the metallic source/drain electrodes 16.

(h) Etch the heavily-doped amorphous silicon 14 between the source and the drain electrodes.

Comparing with the conventional type-A, type-B and type-C TFT, this second embodiment has the following advantages:

(1) The number of masks is one less than that for type-C.

(2) Under back-side illumination, there is no leakage photo-current— similar to type-B and better than type-A or type-C.

(3) Due to the coverage of the edge of the amorphous silicon 13 with the second insulating layer 15, the edge is not in direct contact with the metal of the source and drain electrodes. Under dark condition, a high negative bias at the gate produces only a very small leakage like the type-A and type-C TFT.

(4) The cross-over region between the signal line 17 and the scan line 19 is separated by the first insulating layer 12 and the second insulating layer 15. The likehood of short-circuit between these two lines is greatly reduced.

(5) Except for the direct contact of the n+ a-Si layer 14 and the source/drain electrodes 16, the gate electrode and the source/drain electrodes are separated by two layers of insulators (the first insulating layer 12 and the second insulating layer 15). The structure not only prevents any short circuit between the source/drain electrodes and the gate electrode, but also reduces the stray capacitance between them.

(6) During the deposition of the indium-tin oxide, the amorphous silicon active region is protected with the second insulating layer 15. Thus, the indium cannot contaminate the active region.

In the foregoing description, the amorphous silicon is the major semiconductor and the amorphous silicon nitride is the insulating material. Other semiconductor material and other insulating material can also be used for the thin film transistor, and are within the scope of this invention.

What is claimed is:

1. A thin film field effect transistor (TFT) structure having a gate electrode and an active region with a source, a drain and a channel, and a field region outside said active region, comprising:

an insulating substrate, a gate electrode on said substrate and longer than said active region, a first insulating layer covering said gate electrode, said active region comprises a first semiconductor layer on said first insulating layer, shorter than said gate electrode and serving as said source, said drain and said channel for said TFT, a second semiconductor layer and a third semiconductor layer, which are heavily doped and form contacts for said source and said drain, respectively, a second insulating layer over the first insulating layer covering a portion of top surface of said contacts for said source and said drain, a source metal interconnection to said source and a drain metal interconnection to said drain through the top surface of said of said contacts for the source and the drain, said source metal interconnection and said drain metal interconnection having edges aligned with the edges of said second semiconductor layer and said third semiconductor layer on top of said channel and separated from said gate through said first insulating layer and said second insulating layer, and overlaying said second insulating layer by non-electrical contact areas of said source metal interconnection and said drain metal interconnection.

2. A TFT structure as described in claim 1, wherein said substrate is transparent.

3. A TFT structure as described in claim 1, wherein said first semiconductor layer is amorphous silicon (a-Si).

4. A TFT structure as described in claim 1, wherein said second and third semiconductor layers are heavily doped a-Si.

5. A TFT structure as described in claim 1, wherein the metal for said gate electrode is selected from a group of metal consisting of Al, Cr, Mo, Ta and Ti.

6. A TFT structure as described in claim 1, wherein said first insulating layer is silicon nitride or silicon oxide.

7. A TFT structure as described in claim 1, wherein said second insulating layer is silicon nitride or silicon oxide.

8. A TFT structure as described in claim 1, wherein a transparent conducting layer is formed between said first insulating layer and said second insulating layer in a display region outside said active region, and is contacted to said source metal interconnection at a top surface through a contact hole in said second insulating layer.

9. A TFT structure as described in claim 1, wherein a transparent conducting layer is on the second insulating layer in a display region outside said active region, and is contacted to said source metal interconnection.

* * * * *